United States Patent
Bock

(10) Patent No.: US 12,231,788 B2
(45) Date of Patent: Feb. 18, 2025

(54) METHOD, APPARATUS, AND SYSTEM PROVIDING AN IMAGER WITH PIXELS HAVING EXTENDED DYNAMIC RANGE

(71) Applicant: Lodestar Licensing Group LLC, Evanston, IL (US)

(72) Inventor: Nikolai E. Bock, San Jose, CA (US)

( * ) Notice: Subject to any disclaimer, the term of this patent is extended or adjusted under 35 U.S.C. 154(b) by 0 days.

(21) Appl. No.: 18/389,123

(22) Filed: Nov. 13, 2023

(65) Prior Publication Data

US 2024/0080582 A1 Mar. 7, 2024

Related U.S. Application Data

(60) Continuation of application No. 18/053,299, filed on Nov. 7, 2022, now Pat. No. 11,832,004, which is a continuation of application No. 17/087,305, filed on Nov. 2, 2020, now Pat. No. 11,496,699, which is a continuation of application No. 16/025,842, filed on Jul. 2, 2018, now Pat. No. 10,863,119, which is a continuation of application No. 15/243,266, filed on Aug. 22, 2016, now Pat. No. 10,038,861, which is a
(Continued)

(51) Int. Cl.
| | | |
|---|---|---|
| H04N 25/59 | (2023.01) | |
| H01L 27/146 | (2006.01) | |
| H04N 23/76 | (2023.01) | |
| H04N 25/53 | (2023.01) | |
| H04N 25/583 | (2023.01) | |
| H04N 25/589 | (2023.01) | |
| H04N 25/75 | (2023.01) | |

(52) U.S. Cl.
CPC ....... *H04N 25/59* (2023.01); *H01L 27/14641* (2013.01); *H04N 23/76* (2023.01); *H04N 25/53* (2023.01); *H04N 25/583* (2023.01); *H04N 25/589* (2023.01); *H04N 25/75* (2023.01)

(58) Field of Classification Search
CPC ...... H04N 5/3559; H04N 5/243; H04N 5/353; H04N 5/35554; H04N 5/378; H04N 25/59; H04N 25/589; H04N 25/583; H04N 23/76; H04N 25/75; H04N 25/53; H01L 27/14641

See application file for complete search history.

(56) References Cited

U.S. PATENT DOCUMENTS 6,140,630 A    10/2000  Rhodes
6,175,383 B1 *  1/2001  Yadid-Pecht .......... H04N 25/77
                                                 348/297
(Continued)

FOREIGN PATENT DOCUMENTS

EP    1677522 A1    7/2006
TW    200541320 A  12/2005

OTHER PUBLICATIONS

International Search Report and Written Opinion dated Apr. 25, 2008, issued in corresponding PCT Application No. PCT/US2007/016745.
(Continued)

*Primary Examiner* — Nicholas G Giles

(57) ABSTRACT

The dynamic range of a pixel is increased by using selective photosensor resets during a frame time of image capture at a timing depending on the light intensity that the pixel will be exposed to during the frame time. Pixels that will be exposed to high light intensity are reset later in the frame than pixels that will be exposed to lower light intensity.

16 Claims, 10 Drawing Sheets

Related U.S. Application Data continuation of application No. 14/338,788, filed on Jul. 23, 2014, now Pat. No. 9,426,384, which is a continuation of application No. 13/112,912, filed on May 20, 2011, now Pat. No. 8,917,339, which is a division of application No. 11/509,710, filed on Aug. 25, 2006, now Pat. No. 7,969,490.

(56) References Cited

U.S. PATENT DOCUMENTS

| | | |
|---|---|---|
| 6,204,524 B1 | 3/2001 | Rhodes |
| 6,310,366 B1 | 10/2001 | Rhodes et al. |
| 6,326,652 B1 | 12/2001 | Rhodes |
| 6,333,205 B1 | 12/2001 | Rhodes |
| 6,376,868 B1 | 4/2002 | Rhodes |
| 6,665,010 B1 | 12/2003 | Morris et al. |
| 6,819,358 B1 | 11/2004 | Kagle et al. |
| 6,933,973 B1 | 8/2005 | Sako |
| 7,158,180 B2 | 1/2007 | Neidrich |
| 7,202,463 B1 | 4/2007 | Cox |
| 7,205,522 B2 | 4/2007 | Krymski |
| 7,242,429 B1 | 7/2007 | Lee et al. |
| 7,969,490 B2 | 6/2011 | Bock |
| 8,917,339 B2 | 12/2014 | Bock |
| 9,426,384 B2 | 8/2016 | Bock |
| 10,038,861 B2 | 7/2018 | Bock |
| 10,863,119 B2 | 12/2020 | Bock |
| 2002/0113887 A1 | 8/2002 | Iimura et al. |
| 2002/0122126 A1 | 9/2002 | Lenz |
| 2003/0015647 A1 | 1/2003 | Guo et al. |
| 2003/0179418 A1 | 9/2003 | Wengender et al. |
| 2004/0085459 A1 | 5/2004 | Hoshuyama et al. |
| 2004/0251394 A1 | 12/2004 | Rhodes et al. |
| 2005/0078204 A1 | 4/2005 | Matsuoka et al. |
| 2005/0083421 A1* | 4/2005 | Berezin ............... H04N 25/583 348/E3.018 |
| 2005/0270084 A1 | 12/2005 | Lai et al. |
| 2006/0071254 A1 | 4/2006 | Rhodes |
| 2006/0119593 A1 | 6/2006 | Mabuchi |
| 2006/0139470 A1 | 6/2006 | Mcgowan |
| 2006/0261246 A1 | 11/2006 | Krymski |
| 2007/0058056 A1 | 3/2007 | Kaplinsky et al. |
| 2008/0036887 A1 | 2/2008 | Mizuno et al. |
| 2008/0049133 A1 | 2/2008 | Bock |
| 2008/0112651 A1 | 5/2008 | Cho et al. |
| 2010/0026838 A1 | 2/2010 | Belenky et al. |
| 2010/0214450 A1 | 8/2010 | Rosen |
| 2011/0216233 A1 | 9/2011 | Bock |
| 2014/0333809 A1 | 11/2014 | Bock |
| 2016/0360128 A1 | 12/2016 | Bock |
| 2018/0324370 A1 | 11/2018 | Bock |
| 2021/0051281 A1 | 2/2021 | Bock |

OTHER PUBLICATIONS

Muramatsu, Y., et al., "A Signal-Processing CMOS Image Sensor Using a Simple Analog Operation", IEEE Journal of Solid-State Circuits, IEEE Service Center, Jan. 2003, 101-106.

* cited by examiner

METHOD, APPARATUS, AND SYSTEM PROVIDING AN IMAGER WITH PIXELS HAVING EXTENDED DYNAMIC RANGE

RELATED APPLICATION(S)

This application is a continuation of U.S. patent application Ser. No. 18/053,299, filed Nov. 7, 2022, which is a continuation of U.S. patent application Ser. No. 17/087,305, filed Nov. 2, 2020, which is a continuation of U.S. patent application Ser. No. 16/025,842, filed Jul. 2, 2018, now U.S. Pat. No. 10,863,119, which is a continuation of U.S. patent application Ser. No. 15/243,266, filed Aug. 22, 2016, now U.S. Pat. No. 10,038,861, which is a continuation of U.S. patent application Ser. No. 14/338,788, filed Jul. 23, 2014, now U.S. Pat. No. 9,426,384, which is a continuation of U.S. patent application Ser. No. 13/112,912, filed May 20, 2011, now U.S. Pat. No. 8,917,339, which is a divisional of U.S. patent application Ser. No. 11/509,710, filed Aug. 25, 2006, now U.S. Pat. No. 7,969,490. The entirety of each of these applications and patents is hereby incorporated by reference herein.

TECHNICAL FIELD

The various embodiments relate generally to imagers, and more particularly to an image that includes a pixel with extended dynamic range.

BACKGROUND

Imagers, such as complementary metal oxide semiconductor (CMOS) imagers, are commonly used in photo-imaging applications. A typical imager includes a focal plane array of pixels. Each of the cells includes a photo-conversion device or photosensor such as, for example, a photogate, photoconductor, or photodiode, for generating and accumulating photo-generated charge in a portion of the substrate of the array. A readout circuit is connected to each pixel and includes at least an output transistor, which receives photo-generated charges from a doped diffusion region and produces an output signal that is read-out through a pixel access transistor.

CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, and 6,333,205, all of which are assigned to Micron Technology, Inc. The disclosures of each of the forgoing are hereby incorporated by reference herein in their entirety.

FIG. 1 illustrates a typical four transistor pixel 50 utilized in an imager, such as a CMOS imager. The pixel 50 includes a photosensor 52 (e.g., photodiode, photogate, etc.), a storage node configured as a floating diffusion region N, transfer transistor 54, reset transistor 56, source follower transistor 58 and row select transistor 60. The photosensor 52 is connected to the floating diffusion region N by the transfer transistor 54 when the transfer transistor 54 is activated by a transfer control signal TX. The reset transistor 56 is connected between the floating diffusion region N and an array pixel supply voltage VAA. A reset control signal RESET is used to activate the reset transistor 56, which resets the floating diffusion region N to a known state as is known in the art.

The source follower transistor 58 has its gate connected to the floating diffusion region N and is connected between the array pixel supply voltage VAA and the row select transistor 60. The source follower transistor 58 converts the charge stored at the floating diffusion region N into an electrical output voltage signal. The row select transistor 60 is controllable by a row select signal ROW for selectively outputting the output voltage signal OUT from the source follower transistor 58. For each pixel 50, two output signals are conventionally generated, one being a reset signal $V_{rst}$ generated after the floating diffusion region N is read, the other being an image signal $V_{sig}$ generated after charges are transferred from the photosensor 52 to the floating diffusion region N.

FIG. 2 shows an imager 200 that includes an array 230 of pixels (such as the pixel 50 illustrated in FIG. 1) and a timing and control circuit 232. The timing and control circuit 232 provides timing and control signals for enabling the reading out of signals from pixels of the array 230 in a manner commonly known to those skilled in the art. The array 230 has dimensions of M rows by N columns of pixels, with the size of the array 230 depending on a particular application.

Signals from the imager 200 are typically read out a row at a time using a column parallel readout architecture. The timing and control circuit 232 selects a particular row of pixels in the array 230 by controlling the operation of a row addressing circuit 234 and row drivers 240. Signals stored in the selected row of pixels are provided to a readout circuit 242 in the manner described above. The signal read from each of the columns is then read out sequentially using a column addressing circuit 244. Differential pixel signals (Vrst, Vsig) corresponding to the pixel reset signal and image pixel signal are provided as respective outputs $V_{out1}$, $V_{out2}$ of the readout circuit 242.

The pixels 50, of pixel array 230, have a characteristic dynamic range. Dynamic range refers to the range of incident light that can be accommodated by a pixel in a single image frame. It is desirable to have pixels with a high dynamic range to image scenes that generate high dynamic range incident signals, such as indoor rooms with windows to the outside, outdoor scenes with mixed shadows and bright sunshine, and night-time scenes combining artificial lighting and shadows.

The dynamic range for a pixel is commonly defined as the ratio of its largest non-saturating signal to the standard deviation of its noise under dark conditions. The dynamic range is limited on an upper end by the charge saturation level of the pixel photosensor, and on a lower end by noise imposed limitations and/or quantization limits of the analog-to-digital converter used to produce a digital signal from analog pixel signals. When the dynamic range of a pixel is too small to accommodate the variations in light intensities of the imaged scene, e.g. by having a low saturation level, image distortion occurs.

One approach to increasing dynamic range is to provide structures to increase dynamic range, which includes structures for signal companding, multiple signal storage, and signal controlled reset. Companding involves compressing and subsequently expanding a signal to increase the dynamic range, but suffers from drawbacks such as requiring a non-linear output that hampers subsequent processing and causes increased pixel fixed pattern noise (FPN), a dip in the signal to noise ratio (SNR) at the knee point, and low contrast at high brightness. Structures providing multiple signal storage and signal controlled reset may not be practical because they require an increase in die area due to additional column circuitry.

Another approach to increase dynamic range is to use multiple image captures with different integration times.

Dual capture, for example, is relatively simple to implement, but suffers from an SNR dip at the knee point of the collected charge relative to output signal. A multiple capture approach that requires more than two image captures is quite difficult to implement and requires high speed nondestructive readout along with on-chip memory and additional column circuitry.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Although various embodiments are described herein with reference to the architecture of one pixel, it should be understood that this is representative of a plurality of pixels in an array of an imager. The following detailed description is, therefore, not to be taken in a limiting sense, and the scope of the invention is defined only by the appended claims.

The disclosed embodiments increase the dynamic range of an imager using multiple pixel resets to reset the accumulated charge on the pixel photosensor. The accumulated charge in the photosensor is reset at varying times during a frame time depending on the light intensity that the pixel will be exposed to during the frame time. Pixels that will be exposed to high light intensity are reset later in the frame than pixels that will be exposed to lower light intensity. This reduces the value of the pixel image signal produced by pixels exposed to high light intensity relative to pixels exposed to low light intensity and increases the dynamic range as the pixel image signal exposed to high light intensity can be expanded during digital signal processing.

The light intensity that the pixels will be exposed to during the frame time is initially determined. This may be accomplished using the same latency approach as is used in automatic exposure techniques, which are known in the art. The light intensity that each pixel in the array will be exposed to may be mapped together with the automatic exposure technique using the image processor or a camera processor.

Preset thresholds of light intensity are used to designate a plurality of light intensity ranges. Each light intensity range is associated with a brightness value. The light intensity may be divided into two, three, four, or more ranges. Each pixel exposed to light intensity falling into a range is assigned the brightness value associated with that range and that value is associated with a time of application of a photosensor reset signal for the pixel.

Figure 3:
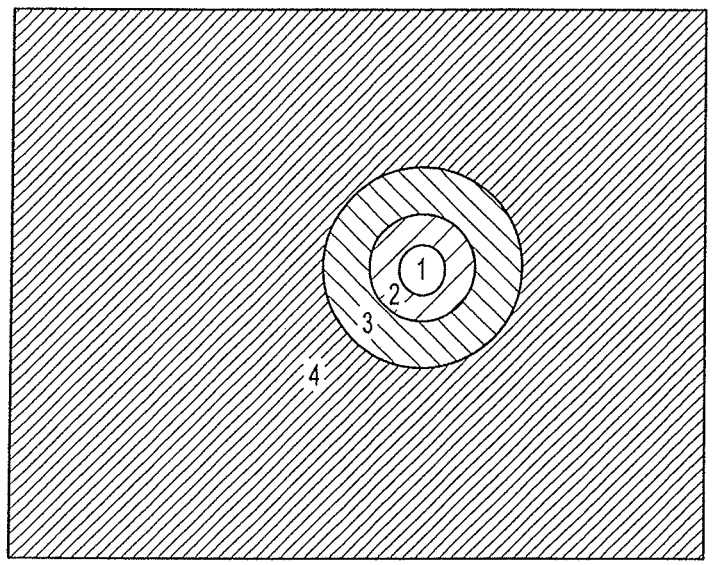
FIG. 3 shows pixels divided into brightness zones according to an embodiment.

In one embodiment, the brightness value for each pixel is stored to memory. In another embodiment, to save memory, pixels having the same brightness value may be grouped into zones of pixels and the dimensions of the zones may be stored to memory. FIG. 3, for example, shows an image field, divided into four brightness zones, 1, 2, 3, and 4 in which the corresponding pixels (not shown) may be grouped. Each of the four zones, 1, 2, 3, and 4, may therefore be made up of pixels assigned with the same brightness value.

Figure 4:
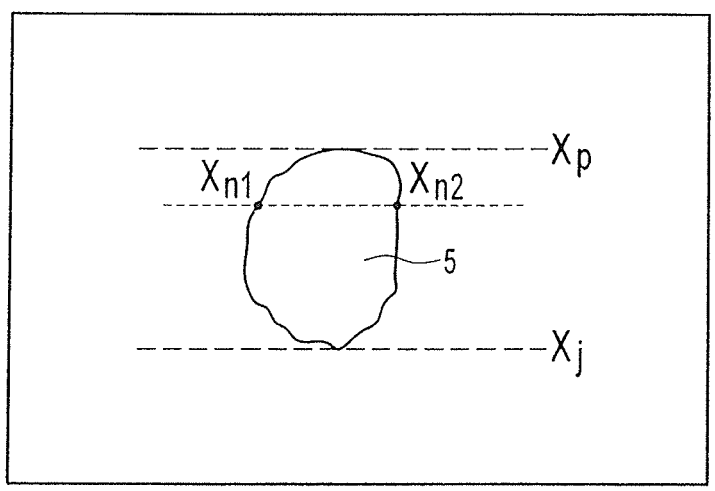
FIG. 4 shows a zone bounded by various coordinates according to an embodiment.

FIG. 4, for example, shows one zone 5 of same brightness value pixels in which the $n^{th}$ row of pixels is bounded on the left by the coordinate $X_n1$ and on the right by the coordinate $X_{n2}$. The zone is bounded on the top by row "p" and at the bottom by row "j". Therefore, rather than storing the same brightness value for each pixel in the zone, two horizontal coordinates for each row and two vertical coordinates for the entire brightness zone can be saved to memory, thus reducing the size of the required memory.

Figure 5:
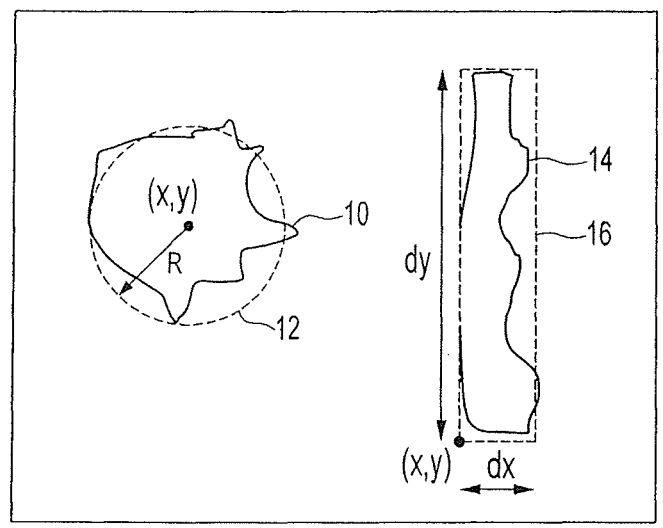
FIG. 5 shows zones having complex shapes that may be approximated by shapes according to an embodiment.

In another embodiment, to save memory, brightness zones with the same brightness value but having complex shapes may be approximated by one or more shapes having easily defined areas, such as circles, rectangles, ovals, triangles, annular rings, and others. FIG. 5, for example, shows a complex shape 10, that may be approximated by a circle 12. The area of the circle 12 may be saved to memory by saving the "x" and "y" coordinates of the center of the circle and the radius R of the circle. FIG. 5 also shows another complex shape 14 that may be approximated by a rectangle 16. The area of the rectangle may be saved to memory by saving the "x" and "y" coordinates of one corner of the rectangle and the length dy and width dx of the rectangle.

Figure 6:
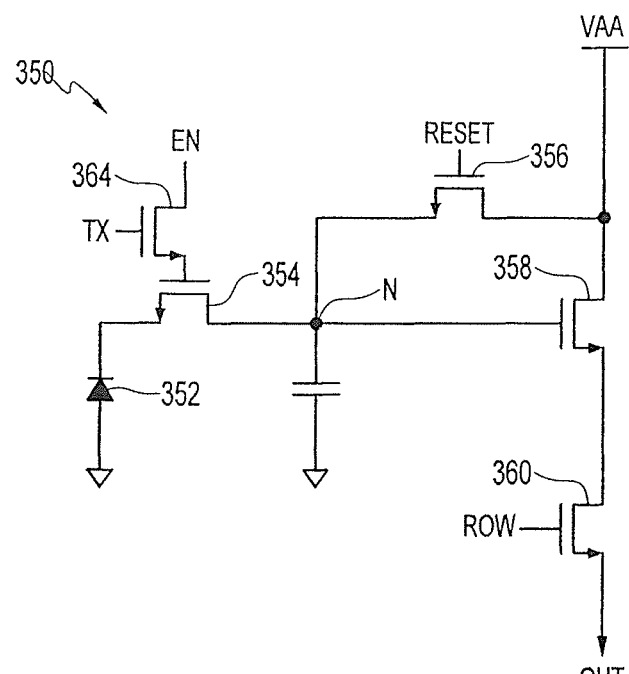
FIG. 6 shows a portion of an imager constructed in accordance with an embodiment.

Once a brightness value has been assigned to each pixel and the values have been stored to memory either directly or as zone coordinates, the array of pixels may be operated to capture an image. FIG. 6 shows a pixel 350 for use in a rolling shutter imager constructed in accordance with an embodiment of the invention. The pixel 350 includes a photosensor 352 (e.g., photodiode, photogate, etc.), floating diffusion region N for storing charge, transfer transistor 354, reset transistor 356, source follower transistor 358, row select transistor 360, and photosensor reset transistor 364. The drain of the transfer transistor 354 is connected to the photosensor 352. The source of the transfer transistor 354 is connected to the floating diffusion region N. The source of the photosensor reset transistor 364 is connected to the gate of the transfer transistor 354. The source of the reset transistor 356 is connected to the floating diffusion region N. The drain of the reset transistor 356 is connected to the supply voltage VAA. The gate of the source follower transistor 358 is connected to the floating diffusion region N. The drain of the source follower transistor 358 is connected to the supply voltage VAA. The source of the source follower transistor 358 is connected to the drain of the row select transistor 360. An enable signal EN is applied to the drain of the photosensor reset transistor 364. A transfer control signal TX is applied to the gate of the photosensor reset transistor 364. A reset control signal RESET is applied to the gate of the reset transistor 356. A row select signal ROW is applied to the gate of the row select transistor 360.

Figure 7:
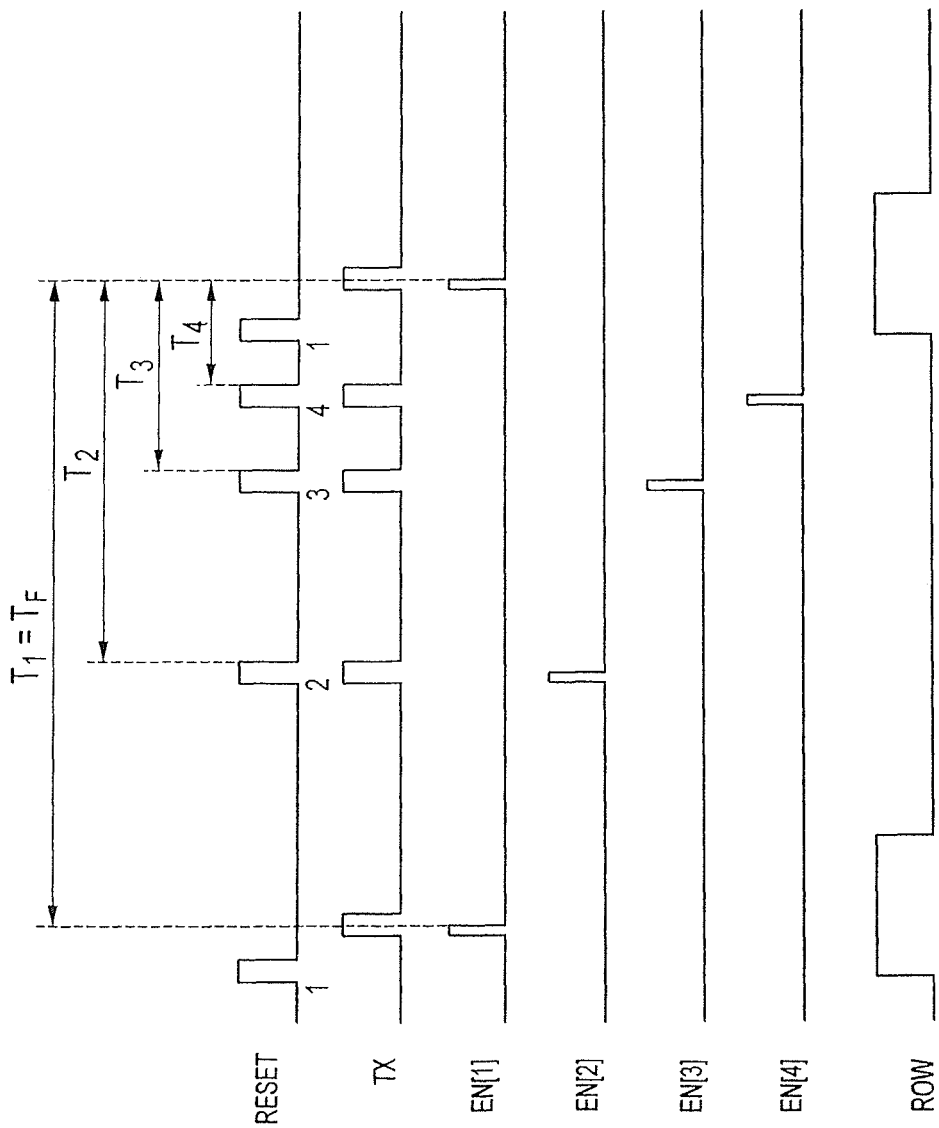
FIG. 7 is a timing diagram for operations of the imager shown in FIG. 6.

FIG. 7 is an example of a timing diagram which may be used to operate the rolling shutter sensor pixel 350 of FIG. 6. The operation of the pixel 350 is now described with reference to FIGS. 6 and 7.

The reset control signal RESET is pulsed once during each frame time $T_F$ for each brightness value that may be assigned to each pixel. In this embodiment, four brightness values are used, and therefore, four reset control signals $RESET_1$, $RESET_2$, $RESET_3$, $RESET_4$ will be pulsed during the frame time $T_F$.

The transfer control signal TX is pulsed and applied to the photosensor reset transistor 364 at the same time as the reset control signals $RESET_2$, $RESET_3$, $RESET_4$ to turn on transfer gate 354 when an enable signal EN is present at the photosensor reset transistor 364, and thus reach the photosensor while the reset transistor 356 is on. The transfer control signal TX activates the photosensor reset transistor 364.

Depending on the brightness value assigned to the pixel 350, a dedicated column controller pulses an enable signal EN[2], EN[3], or EN[4] during the pulsing of one of the reset control signals $RESET_2$, $RESET_3$, $RESET_4$ and transfer control signals TX. The enable signal EN[2], EN[3], or EN[4] activates the transfer transistor 354 to transfer any accumulated charge from the photosensor 352 to the floating diffusion region N, which is then under reset, and thus resets the photosensor 352 to restart charge integration. The enable signal EN[1], EN[2], EN[3], or EN[4] pulse should be shorter than the transfer control signal TX pulse to ensure that the transfer gate transistor 354 is completely off before the reset control signal RESET resets the floating diffusion region N, which discards the charge transferred from the photosensor 352. This ensures that the transfer transistor 354 is completely off during charge integration.

If the brightness value assigned to the pixel 350 is low, the pixel 350 will receive only the first enable signal EN[1] to reset and read out the charge on the photosensor 352 at the end of the frame time $T_F$ so that the photosensor 352 may accumulate charge over a first integration time $T_1$, which is equal to the entire frame time $T_F$. Regardless of the brightness value assigned, each pixel at least receives the first enable signal EN[1] during each frame time $T_F$ to reset and read out the charge on the photosensor 352. If the brightness value assigned to the pixel 350 is of a lower intermediate value, the pixel 350 will receive the second enable signal EN[2] to reset the photosensor near the middle of the frame time $T_F$ so that the photosensor 352 will accumulate charge over a shorter integration time $T_2$. If the brightness value assigned to the pixel 350 is of a higher intermediate value, the pixel 350 will receive the third enable signal EN[3] to reset the photosensor towards the end of the frame time $T_F$ so that the photosensor 352 will accumulate charge over an even shorter integration time $T_2$. If the brightness value assigned to the pixel 350 is high, the pixel 350 will receive the fourth enable signal EN[4] to reset the photosensor 352 near the end of the frame time $T_F$, so that the photosensor 352 will accumulate charge over the shortest integration time $T_4$.

Pixel reset occurs at the end of the frame time $T_F$ for a given row. The reset control signal RESET is pulsed at $RESET_1$ to the gate of the reset transistor 356 to reset the floating diffusion region N. The pixel reset signal $V_{rst}$ is sampled during $RESET_1$ by applying the charge on the floating diffusion region to the gate of the source follower transistor 358 to generate the pixel reset signal $V_{rst}$. A row select signal ROW is applied to the row select transistor 360 to output the pixel reset signal $V_{rst}$. The pixel reset signal $V_{rst}$ is then stored by column readout circuitry (not shown) connected to a column line, which is connected to the pixel 350.

After this, the transfer control signal TX and the enable signal EN[1] are pulsed to transfer any charge accumulated from the photosensor 352 to the floating diffusion region N. The charge on the floating diffusion region N is applied to the gate of the source follower transistor 358 to generate the pixel image signal $V_{sig}$. The row select signal ROW is applied to the row select transistor 360 to output the pixel image signal $V_{sig}$. The pixel image signal $V_{sig}$ is stored in column circuits (not shown) connected to the column line, which is connected to pixel 350. The next integration period for pixels in a given row starts when EN[1] is off.

The pixel reset signal $V_{rst}$ and the pixel image signal $V_{sig}$ are then subtracted to produce a differential signal and the differential signal is digitized and sent to an image processor. The gain of the digital signal is then adjusted by the image processor using a value that correlates to the brightness value to represent the actual light intensity to which the pixel 350 was exposed.

The floating diffusion region N may therefore store similar amounts of charge and cause the source follower transistor 358 to produce pixel image signals $V_{sig}$ with similar values regardless of whether the pixel is exposed to low light, intermediate light, or bright light. Also, resetting the charge at varying times may prevent the floating diffusion region N from becoming saturated and may thus prevent blooming.

Figure 1:
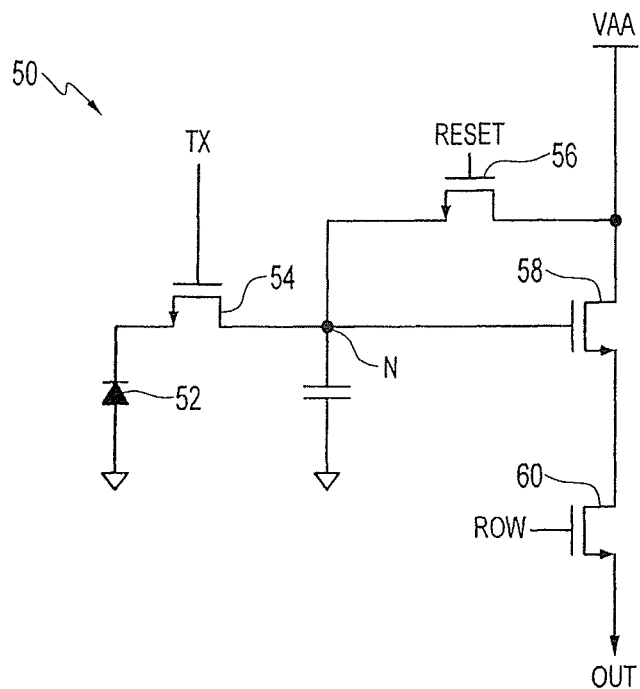
FIG. 1 shows a portion of a conventional imager.
Figure 2:
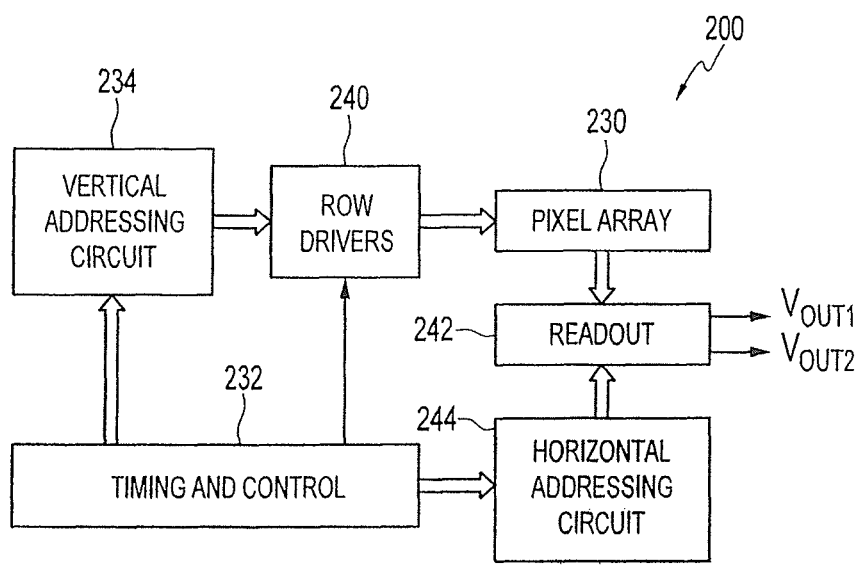
FIG. 2 is a block diagram of a conventional imager.

Each of the four zones, 1, 2, 3, and 4, shown in FIG. 2 is made up of pixels assigned with the same brightness value, and therefore, every pixel in a particular zone should be exposed to a light intensity that falls within the light intensity thresholds of the light intensity range assigned to that zone. The light intensity range should correspond to the saturation level for a given integration time, where the integration time is fixed by the enable signal EN sent to the pixels. Using more zones, e.g. using more, smaller light intensity ranges and more integration times, results in less SNR dip. The SNR dip when the integration time is switched from T1 to T2 is calculated by the equation:

$$SNR_{dip}=10*\log(T_1/T_2)$$

Figure 8:
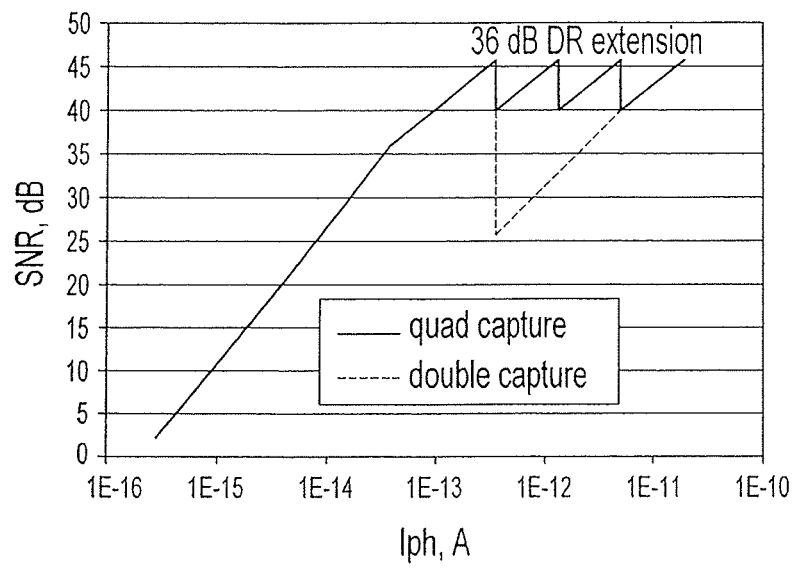
FIG. 8 is a graph of signal to noise ratio versus photocurrent for dual sampling and quadruple sampling operations according to embodiments.

FIG. 8 shows SNR versus photocurrent when using two zones for dual sampling 802 and four zones for quadruple sampling 804. It can be seen from FIG. 8 that dual sampling 802 causes SNR to drop 20 dB with 36 dB DR extension.

The quadruple sampling 804 causes SNR to drop only 5 dB with the same 36 dB DR extension. As is apparent from the foregoing discussion, although one embodiment has been described in which four brightness values and four associated photosensor reset signals EN[1], EN[2], EN[3], EN[4] are employed, a larger or smaller number of brightness levels and associated reset signals may be employed in any of the described embodiments.

Figure 9:
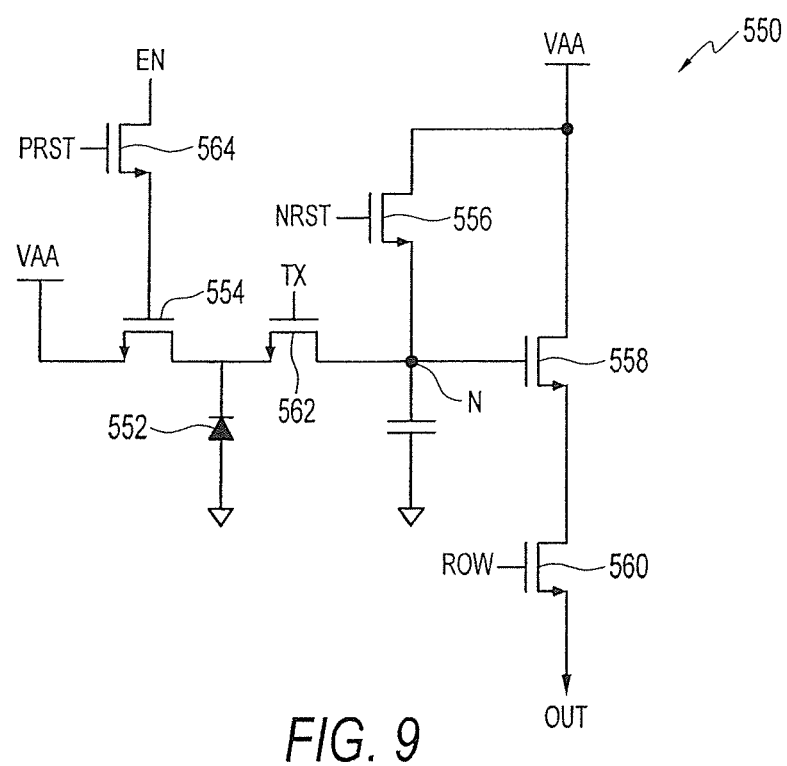
FIG. 9 shows a portion of an imager constructed in accordance with another embodiment.

FIG. 9 shows a global shutter pixel 550 for use in an imager constructed in accordance with another embodiment. The pixel 550 includes a photosensor 552 (e.g., photodiode, photogate, etc.), a floating diffusion region N, an anti-blooming transistor 554, a reset transistor 556, a source follower transistor 558, a row select transistor 560, a transfer transistor 562, and a photosensor reset transistor 564. The photosensor 552 is connected to the drain of the anti-blooming transistor 554 and the drain of the transfer transistor 562. The gate of the anti-blooming transistor 554 is connected to the source of the photosensor reset transistor 564. The source of the anti-blooming transistor 554 is connected to the supply voltage VAA. The source of the photosensor reset transistor 562 is connected to the floating diffusion region N. The source of the reset transistor 556 is connected to the floating diffusion region N. The drain of the reset transistor 556 is connected to the supply voltage VAA. The gate of the source follower transistor 558 is connected to the floating diffusion region N. The drain of the source follower transistor 558 is connected to the supply voltage VAA. The source of the source follower transistor 558 is connected to the drain of the row select transistor 560. An enable signal EN is applied to the drain of the photosensor reset transistor 564. A transfer control signal TX is applied to the gate of the photosensor reset transistor 562. A floating diffusion reset control signal NRST is applied to the gate of the reset transistor 556. A photosensor reset control signal PRST is applied to the gate of the photosensor reset transistor. A row select signal ROW is applied to the gate of the row select transistor 560.

Figure 10:
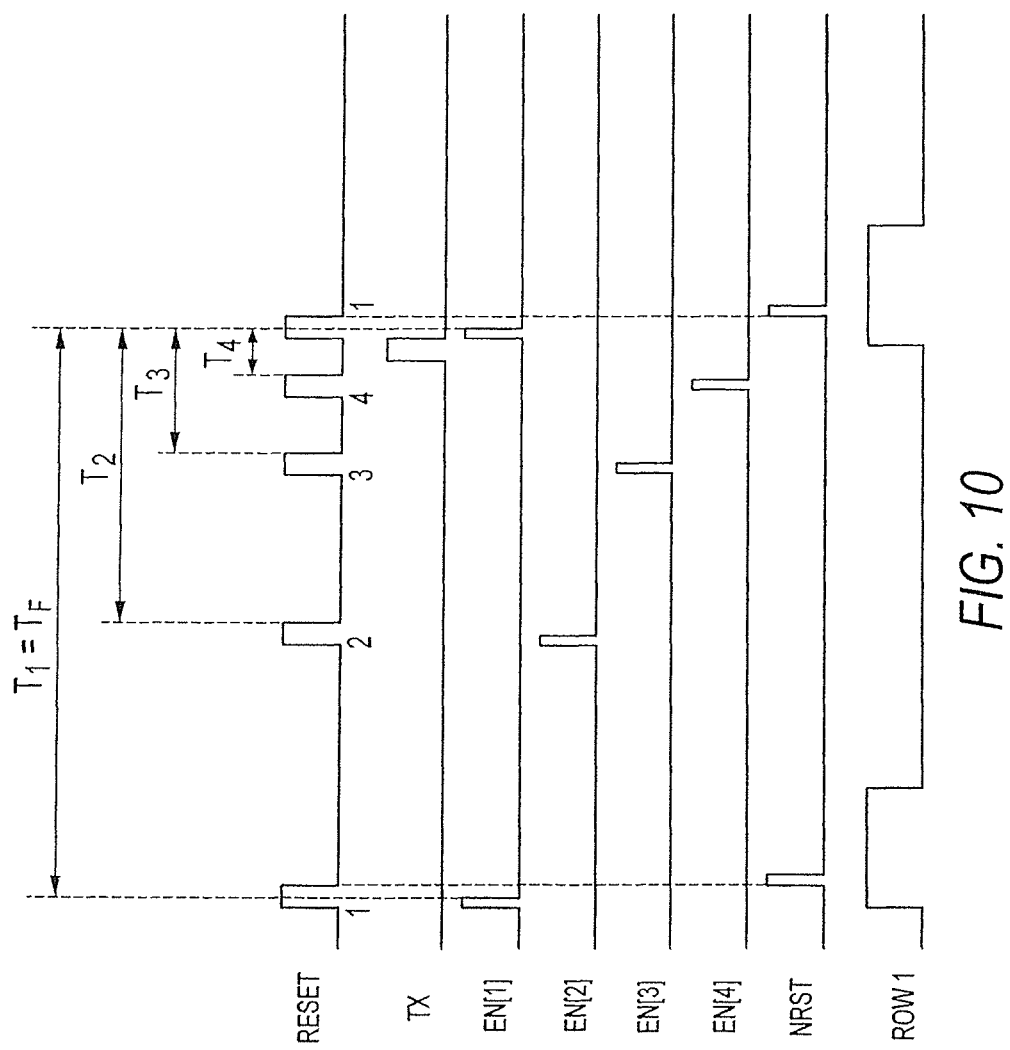
FIG. 10 is a timing diagram for operations of the imager shown in FIG. 9.

FIG. 10 is a timing diagram illustrating the timing of the signals to operate the pixel 550 of FIG. 9. The operation of the pixel 550 is now described with reference to FIGS. 9 and 10.

The pixel 550 is assigned a brightness value and the brightness value is stored to memory as described above. In the illustrated embodiment, the pixel 550 is assigned one of four brightness values.

A photosensor reset control signal PRST is pulsed four times (once for each of four brightness values that may be assigned) and applied to the gate of the photosensor reset transistor 564.

A dedicated column controller pulses a first enable signal EN[1] during the first photosensor reset control signal $PRST_1$ pulse and, depending on the brightness value assigned to the pixel 550, may pulse another enable signal EN[2], EN[3], or EN[4] during the pulsing of one of the second $PRST_2$, third $PRST_3$, or fourth $PRST_4$ photosensor reset control signal PRST pulses, respectively. The enable signal EN[1], EN[3], or EN[4] and read signal PRST activate the anti-blooming transistor 554 to reset the charge on the photosensor 552. The enable signal EN[1], EN[2], or EN[4] pulse should be shorter than the photosensor reset control signal PRST pulse to ensure that the anti-blooming transistor 554 is completely off before charge integration begins.

Similarly to the embodiment described above, the pixel 550 will receive the first enable signal EN[1], and based on the assigned brightness value, may receive a second enable signal EN[2], third enable signal EN[3], or fourth enable signal to reset the photosensor 552 at the beginning, near the middle, towards the end, or near the end, respectively, of the frame time $T_F$.

At the end of the frame time $T_F$, the transfer control signal TX is pulsed and applied to the transfer transistor 562 to transfer any charge accumulated during the integration period from the photosensor 552 to the floating diffusion region N. The charge on the floating diffusion region N is applied to the gate of the source follower transistor 558 to generate the pixel image signal $V_{sig}$. The row select signal ROW is applied to the row select transistor 560 to output the pixel image signal $V_{sig}$. The pixel image signal $V_{sig}$ is stored in column circuitry (not shown) connected to a column line, which is connected to the pixel 350.

The floating diffusion region reset control signal NRST is pulsed and applied to the gate of the reset transistor 556 to reset the floating diffusion region N at the row readout time, which happens once in the frame time $T_F$. The charge on the floating diffusion region N is applied to the gate of the source follower transistor 558 to generate the pixel reset signal $V_{rst}$. A row select signal ROW is applied to the row select transistor 560 to output the pixel reset signal $V_{rst}$. The pixel reset signal $V_{rst}$ is stored in column circuitry (not shown) connected to a column line, which is connected to the pixel 550.

The pixel reset signal $V_{rst}$ and the pixel image signal $V_{sig}$ are then subtracted to produce a differential signal and the differential signal is digitized and sent to an image processor. The gain of the digital signal is then adjusted by the image processor using a value that correlates to the brightness value to represent the actual light intensity to which the pixel 550 was exposed.

Figure 11:
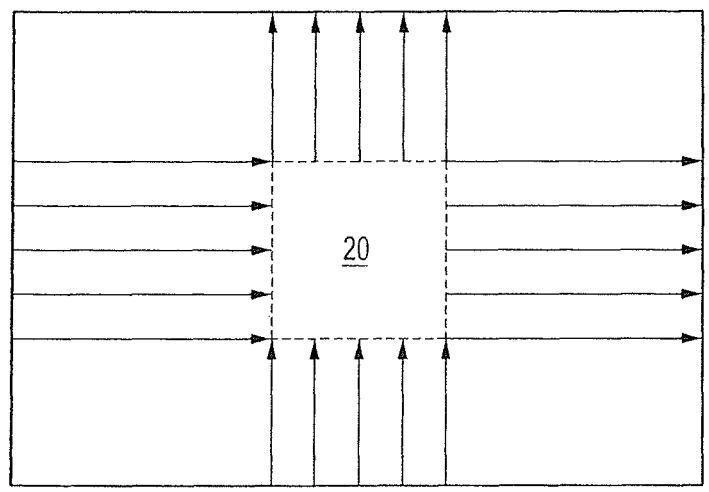
FIG. 11 shows a global shutter sensor window.
Figure 12:
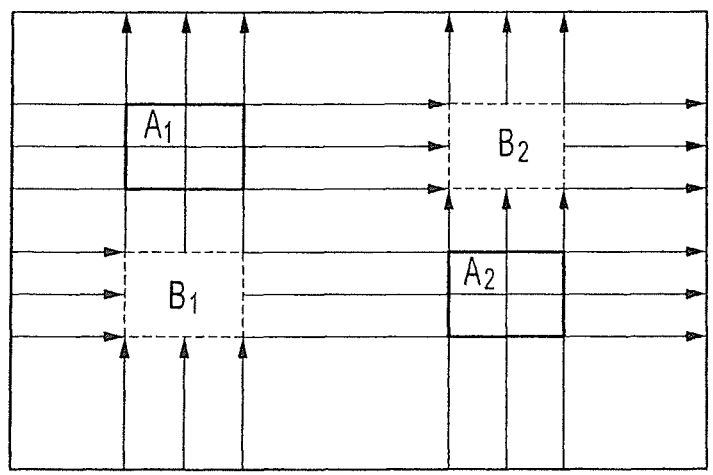
FIG. 12 shows selected brightness zones and generated false brightness zones according to an embodiment.

It is desired that the dimensions of the pixel zones be rectangular when a global shutter sensor pixel is used because a global shutter sensor window is rectangular. FIG. 11 shows a global shutter sensor window 20. Furthermore, two or more zones of the same brightness cannot be selected simultaneously because this will generate false brightness zones. FIG. 12 shows a situation where brightness zones $A_1$ and $A_2$ are selected at the same time and false brightness zones $B_1$ and $B_2$ are generated. The false brightness zones $B_1$ and $B_2$ are generated because the column lines are the same for the areas $A_1$ and $A_2$ where different integration times are desirable and for areas $B_1$ and $B_2$, respectively, in which different integration times are not desirable. This situation may be corrected by using more complicated timing, by dropping the false readouts in later processing, or by adjusting the gains.

Figure 13:
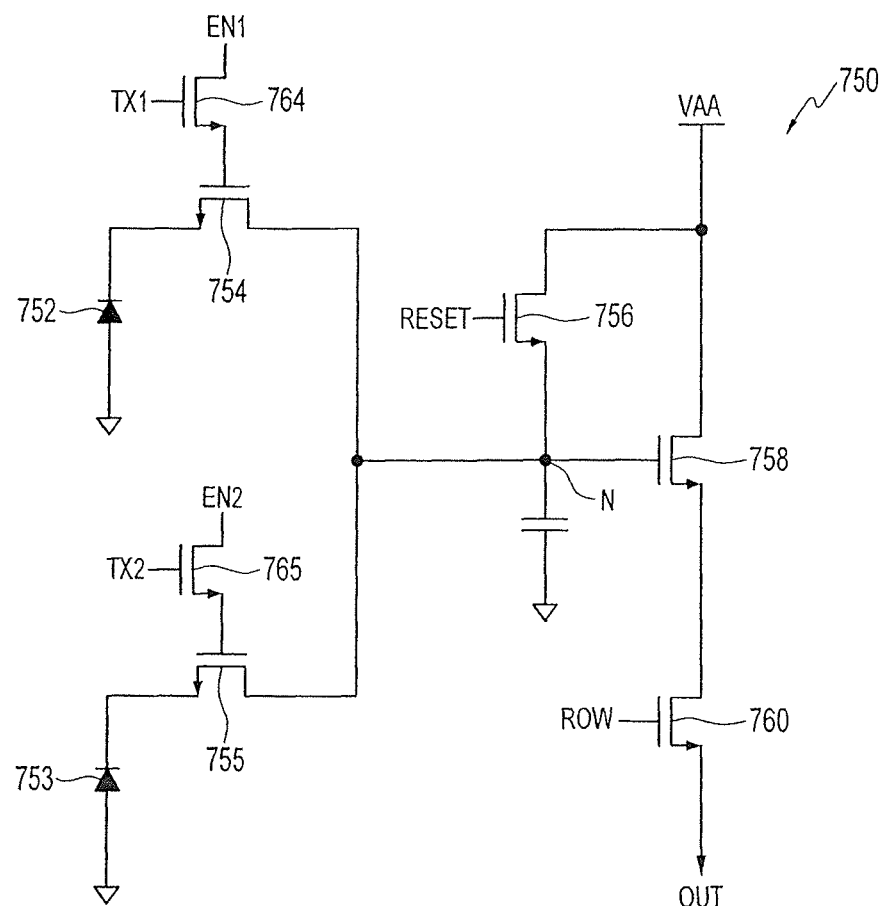
FIG. 13 shows a portion of a shared pixel imager constructed in accordance with an embodiment.
Figure 14:
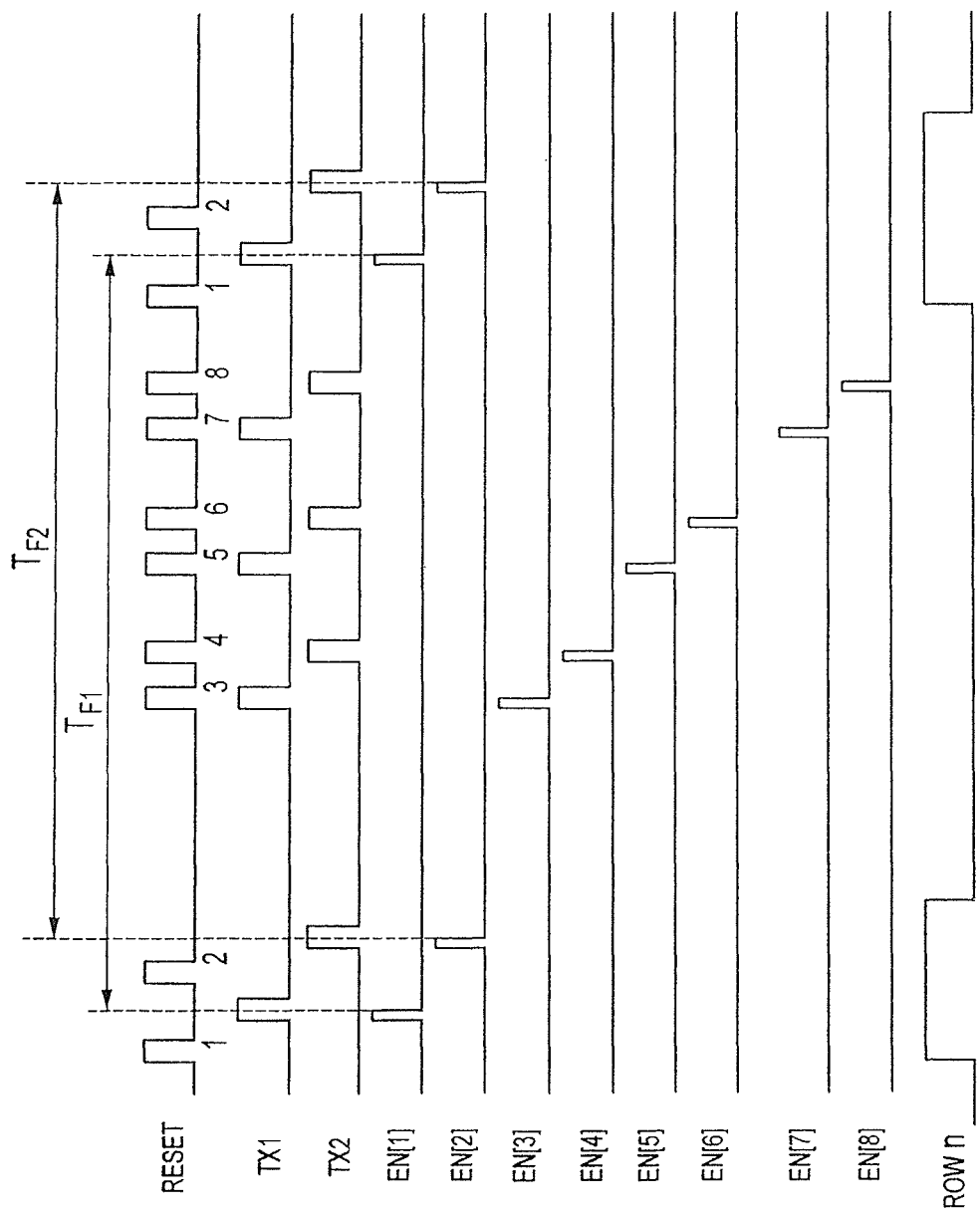
FIG. 14 is a timing diagram for operations of the imager shown in FIG. 13.

A rolling shutter sensor with shared pixel may also be constructed in accordance with an embodiment. FIG. 13 shows an example of a shared pixel 750 for use in an imager constructed in accordance with an embodiment of the invention. The pixel 750 includes a first photosensor 752 (e.g., photodiode, photogate, etc.), a second photosensor 753, a floating diffusion region N, a reset transistor 756, a source follower transistor 758, a row select transistor 760, a first transfer transistor 754, a second transfer transistor 755, a first photosensor reset transistor 764 and a second photosensor reset transistor 765. The drain of the first transfer transistor 754 is connected to the first photosensor 752. The drain of the second transfer transistor 755 is connected to the second photosensor 753. The source of the first transfer transistor 754 is connected to the floating diffusion region N. The source of the second transfer transistor 755 is connected to the floating diffusion region N. The source of the first photosensor reset transistor 764 is connected to the gate of the first transfer transistor 754. The source of the second photosensor reset transistor 765 is connected to the gate of the second transfer transistor 755. The source of the reset transistor 756 is connected to the floating diffusion region N. The drain of the reset transistor 756 is connected to the supply voltage VAA. The gate of the source follower transistor 758 is connected to the floating diffusion region N. The drain of the source follower transistor 758 is connected to the supply voltage VAA. The source of the source follower transistor 758 is connected to the drain of the row select transistor 760. A first enable signal EN1 is applied to the drain of the first photosensor reset transistor 764. A second enable signal EN2 is applied to the drain of the second photosensor reset transistor 765. A first transfer control signal TX1 is applied to the gate of the first photosensor reset transistor 764. A second transfer control signal TX2 is applied to the gate of the second photosensor reset transistor 765. A reset control signal RESET is applied to the gate of the reset transistor 756. A row select signal ROW is applied to the gate of the row select transistor 760. FIG. 14 is a timing diagram illustrating the timing of the signals to operate the shared rolling shutter sensor pixel 750 of FIG. 13. The operation of the pixel 750 is now described with reference to FIGS. 13 and 14.

The reset control signal RESET is pulsed once for each of the two frame times $T_{F1}$ and $T_{F2}$ for each brightness value that may be assigned to each pixel. In this embodiment, four brightness values are used, and therefore, eight reset control signals $RESET_1$, $RESET_2$, $RESET_3$, $RESET_4$, $RESET_5$, $RESET_6$, $RESET_7$, $RESET_8$ will be pulsed during the frame times $T_{F1}$ and $T_{F2}$.

The first transfer control signal TX1 is pulsed and applied to the first photosensor reset transistor 764 at the same time as the reset control signals $RESET_3$, $RESET_5$, $RESET_7$ to turn on the first transfer gate 754 when an enable signal EN is present at the photosensor reset transistor 764, and thus reach the first photosensor 752 while the reset transistor 756 is on. The first transfer control signal TX1 activates the first photosensor reset transistor 764.

Similarly, the second transfer control signal TX2 is pulsed and applied to the second photosensor reset transistor 765 at the same time as the reset control signals $RESET_4$, $RESET_6$, $RESET_8$ to turn on the second transfer gate 755 when an enable signal EN is present at the photosensor reset transistor 764, and thus reach the second photosensor 753 while the reset transistor 756 is on. The second transfer control signal TX2 activates the second photosensor reset transistor 765.

A brightness value is assigned to the first photodiode 752 and the second photodiode 753 of the pixel 750. Depending on the brightness values assigned to the first photodiode 752, a dedicated column controller pulses an enable signal EN[3], EN[5], or EN[7] during the pulsing of one of the reset control signals $RESET_3$, $RESET_5$, $RESET_7$ and first transfer control signal TX1. The enable signal EN[3], EN[5], or EN[7] activates the first transfer transistor 754 to transfer any accumulated charge from the first photosensor 752 to the floating diffusion region N, which is then under reset, and thus resets the first photosensor 752 to restart charge integration.

The same process is conducted for the second photodiode 753, which may be assigned a brightness value different that the one assigned to the first photodiode 752. The dedicated column controller pulses an enable signal EN[4], EN[6], or EN[8] during the pulsing of one of the reset control signals $RESET_4$, $RESET_6$, $RESET_8$ and second transfer control signal TX2 to reset the second photosensor 753 to restart charge integration.

Similarly to the embodiments described above, the first photosensor reset transistor 764 will receive the first enable signal EN[1], and based on the assigned brightness value, may receive a third enable signal EN[3], fifth enable signal EN[5], or seventh enable signal EN[7], to reset the first photosensor 752 at the beginning, near the middle, towards the end, or near the end, respectively, of the frame time $T_{F1}$. The second photosensor reset transistor 765 will receive the second enable signal EN[2], and based on the assigned brightness value, may receive a fourth enable signal EN[4], sixth enable signal EN[6], or eighth enable signal EN[8], to reset the second photosensor 753 at the beginning, near the middle, towards the end, or near the end, respectively, of the frame time $T_{F2}$.

Pixel reset occurs at the end of the frame time $T_{F1}$ for a given row. The reset control signal RESET is pulsed at $RESET_1$ to the gate of the reset transistor 756 to reset the floating diffusion region N. The first pixel reset signal $V_{rst1}$ is sampled during $RESET_1$ by applying the charge on the floating diffusion region to the gate of the source follower transistor 758 to generate the first pixel reset signal $V_{rst1}$. A row select signal ROW is applied to the row select transistor 360 to output the first pixel reset signal $V_{rst1}$. The first pixel reset signal $V_{rst1}$ is then stored by column readout circuitry (not shown) connected to a column line, which is connected to the pixel 750.

After this, the first transfer control signal TX1 and the enable signal EN[1] are pulsed to transfer any charge accumulated from the first photosensor 752 to the floating diffusion region N. The charge on the floating diffusion region N is applied to the gate of the source follower transistor 358 to generate the first pixel image signal $V_{sig1}$. The row select signal ROW is applied to the row select transistor 760 to output the first pixel image signal $V_{sig1}$. The first pixel image signal $V_{sig1}$ is stored in column circuits (not shown) connected to the column line, which is connected to pixel 750. The next integration period $T_{F1}$ for pixels in a given row starts when TX1 is off.

The first pixel reset signal $V_{rst1}$ and the first pixel image signal $V_{sig1}$ are then subtracted to produce a differential signal and the differential signal is digitized and sent to an image processor. The gain of the digital signal is then adjusted by the image processor using a value that correlates to the brightness value to represent the actual light intensity to which the first photosensor 752 was exposed.

A similar process is followed to output the second pixel reset signal $V_{rst2}$ during the second reset control signal $RESET_2$, and to output the second pixel image signal $V_{sig2}$ during the second transfer control signal TX2 and the second enable pulse EN[2] and further process the signals.

Figure 15:
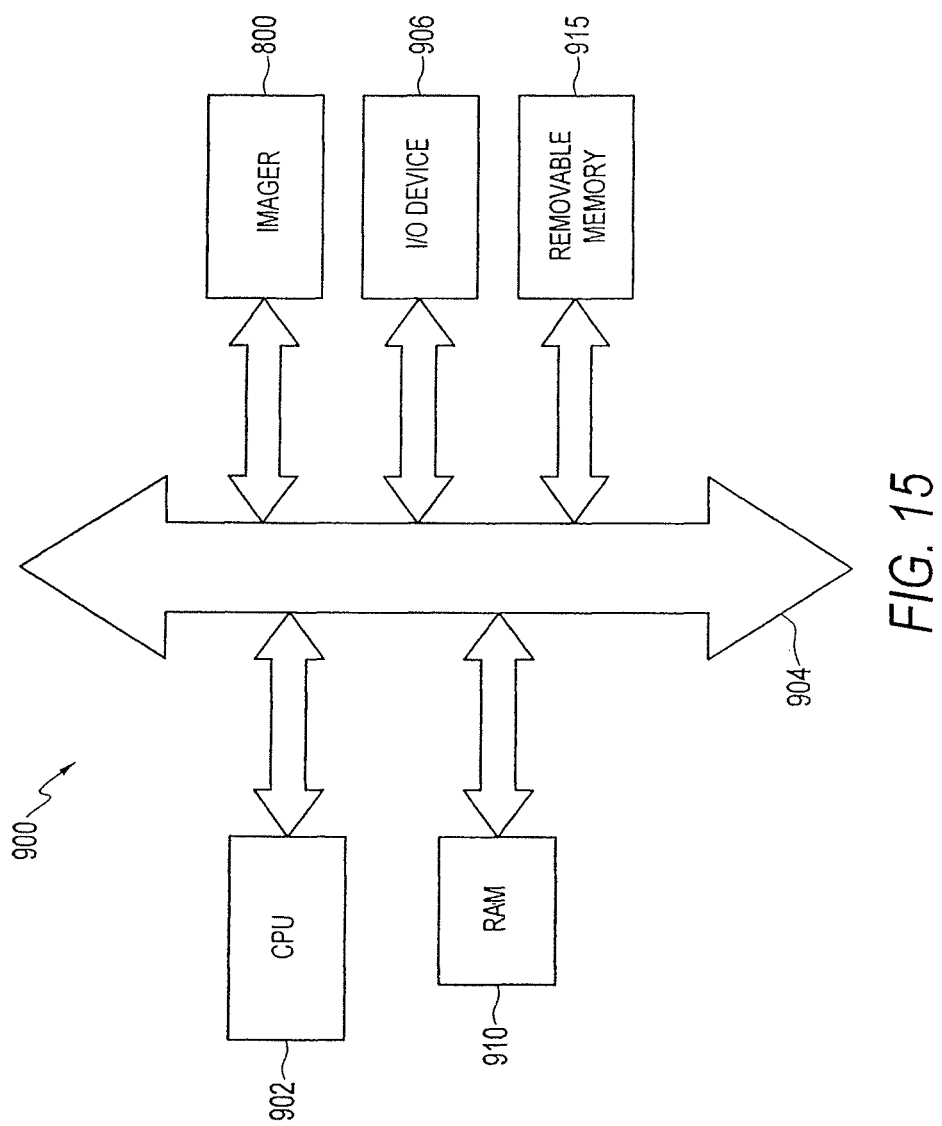
FIG. 15 illustrates a system suitable for use with any one of the embodiments.

FIG. 15 shows system 900, a typical processor system modified to include an imager 800 constructed and operated in accordance with an embodiment. The imager 800 has the overall architecture illustrated in FIG. 2, but is modified to include pixel array 230. The processor system 900 is a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 900, for example a digital still or video camera system, generally comprises a central processing unit (CPU) 902, such as a microprocessor for conducting camera functions, that communicates with one or more input/output (I/O) devices 906 over a bus 904. Imager 400 also communicates with the CPU 902 over the bus 904. The processor system 900 also includes random access memory (RAM) 910, and can include removable memory 915, such as flash memory, which also communicate with the CPU 902 over the bus 904. The imager 800 may be combined with the CPU processor with or without memory storage on a single integrated circuit or on a different chip than the CPU processor.

The processes and devices described above illustrate preferred methods and typical devices of many that could be used and produced. However, it is not intended that the present invention be strictly limited to the above-described and illustrated embodiments. Any modification, though presently unforeseeable, of the present invention that comes within the spirit and scope of the following claims should be considered part of the present invention.

I claim:

1. A method of operating a pixel, comprising:
   determining, based at least in part on a brightness level associated with a photosensor of the pixel, timing for charge transfer from the photosensor to a diffusion region of the pixel during a frame time;
   transferring, at a first time associated with the frame time that is based at least in part on the determined timing, a first accumulated charge from the photosensor to the diffusion region based at least in part on applying, at the first time, a transfer control signal to a gate of a reset transistor between the photosensor and the diffusion region, and applying, at the first time, an enable signal to a drain of the reset transistor, wherein a pulse associated with the enable signal is shorter than a pulse associated with the transfer control signal;
   transferring, at a second time associated the frame time that is after the first time, a second accumulated charge from the photosensor to the diffusion region based at least in part on applying, at the second time, the enable signal to the drain of the reset transistor, the second accumulated charge comprising charge accumulated at the photosensor between the first time and the second time; and
   generating an image signal for the frame time based at least in part on the second accumulated charge transferred from the photosensor to the diffusion region.

2. The method of claim 1, further comprising:
   determining, based at least in part on a second brightness level associated with a second photosensor of a second pixel, second timing for charge transfer from the second photosensor to a second diffusion region of the second pixel during the frame time;
   transferring, at a third time associated with the frame time that is based at least in part on the determined second timing, a third accumulated charge from the second photosensor to the second diffusion region;
   transferring, at the second time associated with the frame time that is after the third time, a fourth accumulated charge from the second photosensor to the second diffusion region, the fourth accumulated charge comprising charge accumulated at the second photosensor between the third time and the second time, wherein the third time is different than the first time based at least in part on the second brightness level being different than the brightness level; and
   generating a second image signal for the frame time based at least in part on the fourth accumulated charge transferred from the second photosensor to the second diffusion region.

3. The method of claim 2, wherein the third time is before the first time based at least in part on the second brightness level being lower than the brightness level.

4. The method of claim 2, wherein the third time is after the first time in the frame time based at least in part on the second brightness level being higher than the brightness level.

5. The method of claim 1, further comprising:
   determining, based at least in part on a second brightness level associated with a second photosensor of a second pixel, second timing for charge transfer from the second photosensor to a second diffusion region of the second pixel during the frame time;
   transferring, at the second time associated with the frame time, a third accumulated charge from the second photosensor to the second diffusion region, the third accumulated charge comprising charge accumulated at the second photosensor between a beginning of the frame time and the second time based at least in part on the second brightness level being lower than the brightness level; and
   generating a second image signal for the frame time based at least in part on the third accumulated charge transferred from the second photosensor to the second diffusion region.

6. The method of claim 1, further comprising:
   discharging, at the first time, a third accumulated charge from the diffusion region based at least in part on applying, at the first time, a reset signal to a gate of a second reset transistor that is coupled with the diffusion region.

7. The method of claim 1, wherein the second time is associated with an end of the frame time.

8. The method of claim 1, further comprising:
   determining, based at least in part on a second brightness level associated with the photosensor, second timing for charge transfer from the photosensor to the diffusion region of the pixel during the frame time, wherein the second brightness level is lower than the brightness level;
   transferring, at a third time associated with the frame time that is based at least in part on the determined second timing, a third accumulated charge from the photosensor to the diffusion region, wherein the third time is earlier in the frame time than the first time based at least in part on the second brightness level being lower than the brightness level;
   transferring, at the second time associated with the frame time that is after the third time, a fourth accumulated charge from the photosensor to the diffusion region, the fourth accumulated charge comprising charge accumulated at the photosensor between the third time and the second time; and
   generating a second image signal for the frame time based at least in part on the fourth accumulated charge transferred from the photosensor to the diffusion region.

9. An apparatus, comprising:
   a photosensor associated with a pixel;
   a diffusion region configured to store charge associated with the pixel; and
   circuitry configured to:
      determine, based at least in part on a brightness level associated with the photosensor, timing for charge transfer from the photosensor to the diffusion region during a frame time;

transfer, at a first time associated with the frame time that is based at least in part on the determined timing, a first accumulated charge from the photosensor to the diffusion region based at least in part on applying, at the first time, a transfer control signal to a gate of a reset transistor between the photosensor and the diffusion region, and applying, at the first time, an enable signal to a drain of the reset transistor, wherein a pulse associated with the enable signal is shorter than a pulse associated with the transfer control signal;

transfer, at a second time associated the frame time that is after the first time, a second accumulated charge from the photosensor to the diffusion region based at least in part on applying, at the second time, the enable signal to the drain of the reset transistor, the second accumulated charge comprising charge accumulated at the photosensor between the first time and the second time; and generate an image signal for the frame time based at least in part on the second accumulated charge transferred from the photosensor to the diffusion region.

10. The apparatus of claim 9, further comprising:
a second photosensor associated with a second pixel; and
a second diffusion region configured to store charge associated with the second pixel, wherein the circuitry is further configured to:
determine, based at least in part on a second brightness level associated with the second photosensor, second timing for charge transfer from the second photosensor to the second diffusion region during the frame time;
transfer, at a third time associated with the frame time that is based at least in part on the determined second timing, a third accumulated charge from the second photosensor to the second diffusion region;
transfer, at the second time associated with the frame time that is after the third time, a fourth accumulated charge from the second photosensor to the second diffusion region, the fourth accumulated charge comprising charge accumulated at the second photosensor between the third time and the second time, wherein the third time is different than the first time based at least in part on the second brightness level being different than the brightness level; and
generate a second image signal for the frame time based at least in part on the fourth accumulated charge transferred from the second photosensor to the second diffusion region.

11. The apparatus of claim 10, wherein the third time is before the first time based at least in part on the second brightness level being lower than the brightness level.

12. The apparatus of claim 10, wherein the third time is after the first time in the frame time based at least in part on the second brightness level being higher than the brightness level.

13. The apparatus of claim 9, further comprising:
a second photosensor associated with a second pixel; and
a second diffusion region configured to store charge associated with the second pixel, wherein the circuitry is further configured to:
determine, based at least in part on a second brightness level associated with the second photosensor, second timing for charge transfer from the second photosensor to the second diffusion region during the frame time;
transfer, at the second time associated with the frame time, a third accumulated charge from the second photosensor to the second diffusion region, the third accumulated charge comprising charge accumulated at the second photosensor between a beginning of the frame time and the second time based at least in part on the second brightness level being lower than the brightness level; and
generate a second image signal for the frame time based at least in part on the third accumulated charge transferred from the second photosensor to the second diffusion region.

14. The apparatus of claim 9, wherein the circuitry is further configured to:
discharge, at the first time, a third accumulated charge from the diffusion region based at least in part on applying, at the first time, a reset signal to a gate of a second reset transistor that is coupled with the diffusion region.

15. The apparatus of claim 9, wherein the second time is associated with an end of the frame time.

16. The apparatus of claim 9, wherein the circuitry is further configured to:
determine, based at least in part on a second brightness level associated with the photosensor, second timing for charge transfer from the photosensor to the diffusion region of the pixel during the frame time, wherein the second brightness level is lower than the brightness level;
transfer, at a third time associated with the frame time that is based at least in part on the determined second timing, a third accumulated charge from the photosensor to the diffusion region, wherein the third time is earlier in the frame time than the first time based at least in part on the second brightness level being lower than the brightness level;
transfer, at the second time associated with the frame time that is after the third time, a fourth accumulated charge from the photosensor to the diffusion region, the fourth accumulated charge comprising charge accumulated at the photosensor between the third time and the second time; and
generate a second image signal for the frame time based at least in part on the fourth accumulated charge transferred from the photosensor to the diffusion region.

* * * * *